United States Patent
Goto et al.

(10) Patent No.: US 10,119,103 B2
(45) Date of Patent: Nov. 6, 2018

(54) CLEANING LIQUID AND METHOD FOR CLEANING

(71) Applicant: TOKYO OHKA KOGYO CO., LTD., Kawasaki-shi (JP)

(72) Inventors: Tatsuo Goto, Kawasaki (JP); Kenji Seki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/439,162

(22) Filed: Feb. 22, 2017

(65) Prior Publication Data
US 2017/0253840 A1    Sep. 7, 2017

(30) Foreign Application Priority Data

Mar. 4, 2016 (JP) ................. 2016-042500

(51) Int. Cl.
| | |
|---|---|
| *C09K 13/00* | (2006.01) |
| *C11D 11/00* | (2006.01) |
| *C11D 3/04* | (2006.01) |
| *C11D 3/28* | (2006.01) |
| *C11D 3/43* | (2006.01) |
| *H01L 21/02* | (2006.01) |
| *C11D 7/08* | (2006.01) |
| *C11D 7/32* | (2006.01) |

(52) U.S. Cl.
CPC .......... *C11D 11/0047* (2013.01); *C11D 3/042* (2013.01); *C11D 3/28* (2013.01); *C11D 3/43* (2013.01); *C11D 7/08* (2013.01); *C11D 7/3281* (2013.01); *H01L 21/02065* (2013.01); *H01L 21/02071* (2013.01)

(58) Field of Classification Search
CPC .................................................. C11D 11/0047
USPC .................................................. 510/175, 176
See application file for complete search history.

(56) References Cited

U.S. PATENT DOCUMENTS

| | | | |
|---|---|---|---|
| 5,792,274 A | 8/1998 | Tanabe et al. | |
| 6,638,899 B1 | 10/2003 | Wakiya et al. | |
| 2009/0301996 A1* | 12/2009 | Visintin | C11D 3/0073 216/13 |
| 2010/0055615 A1* | 3/2010 | Ohishi | G03F 7/322 430/302 |
| 2010/0152086 A1* | 6/2010 | Wu | C11D 3/0073 510/175 |
| 2011/0146516 A1* | 6/2011 | Kawauchi | G03F 7/027 101/453 |
| 2013/0296214 A1* | 11/2013 | Barnes | H01L 21/02063 510/176 |
| 2015/0159124 A1* | 6/2015 | Takahashi | C11D 11/0047 510/175 |
| 2015/0307818 A1* | 10/2015 | Barnes | H01L 21/02063 510/175 |
| 2016/0185595 A1* | 6/2016 | Chen | H01L 21/02063 216/13 |
| 2017/0101608 A1* | 4/2017 | Takahashi | C11D 11/0047 |

FOREIGN PATENT DOCUMENTS

| | | |
|---|---|---|
| JP | H09-197681 | 7/1997 |
| JP | 2000-047401 | 2/2000 |
| JP | 2000-181083 | 6/2000 |
| JP | 2001-083713 | 3/2001 |

* cited by examiner

*Primary Examiner* — Gregory E Webb
(74) *Attorney, Agent, or Firm* — Knobbe Martens Olson & Bear LLP

(57) ABSTRACT

A cleaning liquid including hydrofluoric acid, a tetrazole compound, and water. The tetrazole compound may be represented by the following Formula (B1) in which $R^1$ is a hydrogen atom or an organic group and $R^2$ is a hydrogen atom, a hydroxyl group, a mercapto group, an amino group, or an organic group.

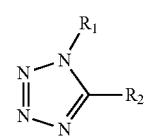

(B1)

19 Claims, No Drawings

CLEANING LIQUID AND METHOD FOR CLEANING

CROSS-REFERENCE TO RELATED APPLICATIONS

This application claims priority to Japanese Patent Application No. 2016-042500, filed Mar. 4, 2016, the entire content of which is incorporated herein by reference.

BACKGROUND OF THE INVENTION

Field of the Invention

The present invention relates to a cleaning liquid and a cleaning method using the cleaning liquid.

Related Art

When semiconductor elements such as IC and LSI, or display elements such as liquid crystal panels are manufactured, a CVD vapor-deposited metal film or an insulating film such as a $SiO_2$ film is first firmed on a substrate such as a silicon wafer or glass. Next, a photoresist pattern or a metal hard mask is formed on the metal film or the insulating film. Then, the substrate is subjected to dry etching using this photoresist pattern or this hard mask as a mask to form a fine circuit. Next, after the pattern or the mask is ashed, residual materials of the photoresist pattern and the residual materials of the hard mask are cleaned and removed using a cleaning liquid.

In elements provided with such a fine circuit formed of a metal film, miniaturization of a circuit is increasingly progressed. In many cases, copper is used as a material of a metal film during formation of a fine circuit. However, in a case of further performing miniaturization of the circuit, there is a problem in that electromigration is easily caused in the fine circuit formed of a copper film.

For this reason, in a case of forming an extremely fine circuit, coating the surface of the circuit with an alloy containing cobalt or cobalt has been proposed in order to prevent electromigration.

On the other hand, it is expected for the cleaning liquid, which can be used in order to clean and remove residual materials of the photoresist pattern and residual materials of the hard mask, to be able to effectively clean and remove these residual materials and to have excellent anticorrosion properties with respect to metals. Use of hydrofluoric acid and a compound in which ammonia is used as a counter amine thereof (refer to Japanese Unexamined Patent Application, Publication No. 2001-83713, Japanese Unexamined Patent Application, Publication No. H9-197681, and Japanese Unexamined Patent Application, Publication No. 2000-47401), hydrofluoric acid and a compound in which 1,8-diazabicyclo[5.4.0]undecene-7 is used as a counter amine thereof (refer to Japanese Unexamined Patent Application, Publication No. 2000-181083), or the like, as such a cleaning liquid has been proposed.

SUMMARY OF THE INVENTION

However, although the cleaning liquids disclosed in Japanese Unexamined Patent Application, Publication No. 2001-83713, Japanese Unexamined Patent Application, Publication No. H9-197681, Japanese Unexamined Patent Application, Publication No. 2000-47401, and Japanese Unexamined Patent Application, Publication No. 2000-181083 exhibit high anticorrosion performance with respect to metals such as copper, these do not necessarily exhibit high anticorrosion performance with respect to cobalt.

The present invention has been made in consideration of the above-described problems and an object of the present invention is to provide a cleaning liquid which is used for removal of residual materials of a photoresist pattern or etching residual materials, or the like and has excellent anticorrosion properties with respect to metals containing cobalt, and a cleaning method using the cleaning liquid.

The present inventors have found that it is possible to solve the above-described problem by making a cleaning liquid contain hydrofluoric acid (A), a tetrazole compound (B), and water (C) and have completed the present invention. More specifically, the present invention provides the following.

According to a first aspect of the present invention, there is provided a cleaning liquid containing hydrofluoric acid (A), a tetrazole compound (B), and water (C).

According to a second aspect of the present invention, there is provided a method for cleaning a substrate using the cleaning liquid according to the first aspect.

According to the present invention, it is possible to provide a cleaning liquid which is used for removal of residual materials of a photoresist pattern or etching residual materials, or the like and has excellent anticorrosion properties with respect to metals containing cobalt, and a cleaning method using the cleaning liquid.

DETAILED DESCRIPTION OF THE INVENTION

Cleaning Liquid

A cleaning liquid contains hydrofluoric acid (A), a tetrazole compound (B), and water (C). In addition, the cleaning liquid may contain a basic compound (D), a water-soluble organic solvent (E), or the like together with the tetrazole compound (B). Hereinafter, each component contained in the cleaning liquid according to the present invention will be described in detail.

Hydrofluoric Acid (A)

The cleaning liquid essentially contains hydrofluoric acid. The content of hydrofluoric acid in the cleaning liquid is preferably 0.001 to 0.5 mass % and more preferably 0.08 to 0.32 mass %. When the content of hydrofluoric acid falls within such a range, cleaning and removing properties of residual materials of a photoresist pattern and etching residual materials can be more effectively balanced with anticorrosion properties with respect to metals containing cobalt.

Tetrazole Compound (B)

The cleaning liquid essentially contains a tetrazole compound (B). When the cleaning liquid contains a tetrazole compound (B), anticorrosion properties of the cleaning liquid with respect to metals containing cobalt are remarkably improved.

The type of tetrazole compound (B) is not particularly limited as long as a compound includes a tetrazole skeleton.

The tetrazole compound (B) may contain a condensed ring formed by condensing a tetrazole ring and another ring. In this case, the tetrazole ring and another ring share a single bond between a nitrogen atom at the 1-position and a carbon atom at the 5-position of the tetrazole ring.

In addition, the tetrazole compound (B) may contain two or more tetrazole rings in one molecule.

The molecular weight of the tetrazole compound (B) is also not particularly limited. Examples of a polymer compound including a tetrazole skeleton include a homopolymer or a copolymer of a tetrazole compound containing an ethylenically unsaturated double bond. As an example of a comonomer in a copolymer, (meth)acrylic acid, (meth) acrylic esters such as methyl(meth)acrylate, or styrene is exemplified.

A compound represented by the following Formula (B1) is preferable as the tetrazole compound (B).

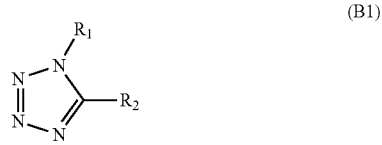

(B1)

(In Formula (B1), $R^1$ is a hydrogen atom or an organic group and $R^2$ is a hydrogen atom, a hydroxyl group, a mercapto group, an amino group, or an organic group.)

The organic groups in $R^1$ and $R^2$ are not particularly limited as long as a group contains a carbon atom and is generally recognized as an organic group.

The organic group may contain a hetero atom. Examples of the hetero atom include an oxygen atom, a nitrogen atom, a sulfur atom, a phosphorus atom, a silicon atom, and a halogen atom, but are not limited thereto.

Suitable examples of the organic group in $R^1$ include an alkyl group, an alkenyl group, a cycloalkyl group, a cycloalkenyl group, an aryl group, and an aralkyl group.

These organic groups may contain a substituent or a bond other than a hydrocarbon group such as a hetero atom in the organic groups. In addition, the organic groups may be either linear, branched, cyclic organic groups, or a combination of these structures.

In a case where $R^1$ is an alkyl group or an alkenyl group, the alkyl group or the alkenyl group may be a linear group or a branched group. The number of carbon atoms of the alkyl group is not particularly limited, but is preferably 1 to 8 and more preferably 1 to 4. The number of carbon atoms of the alkenyl group is not particularly limited, but is preferably 2 to 8 and more preferably 2 to 4.

Specific examples of preferred alkyl groups include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, and a 2-ethyl-n-hexyl group. Specific examples of preferred alkenyl groups include a vinyl group and an allyl group.

In a case where $R^1$ is a cycloalkyl group, the number of carbon atoms of the cycloalkyl group is not particularly limited. The number of carbon atoms of the cycloalkyl group is preferably 3 to 10 and more preferably 4 to 8.

Suitable examples of the cycloalkyl group include a cyclobutyl group, a cyclopentyl group, a cyclohexyl group, a cycloheptyl group, and a cyclooctyl group.

Suitable examples in a case where $R^1$ is a cycloalkenyl group include a cycloalkenyl group corresponding to a preferred group exemplified as the cycloalkyl group.

In a case where $R^1$ is an aralkyl group, the aryl group contained in the aralkyl group may be an aromatic hydrocarbon group or an aromatic heterocyclic group, and is preferably an aromatic hydrocarbon group. The number of carbon atoms of the aralkyl group is preferably 7 to 20 and more preferably 7 to 12.

Suitable examples of the aralkyl group include a benzyl group, a phenethyl group, an α-naphthylmethyl group, and a β-naphthylmethyl group.

The alkyl group, the alkenyl group, the cycloalkyl group, the cycloalkenyl group, and the aralkyl group which have been described above may have a substituent. The type of the substituent is not particularly limited as long as the type of the substituent does not disturb the object of the present invention.

Examples of preferred substituents include a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, an amino group, a monoalkylamino group, a dialkylamino group, a monoarylamino group, a diarylamino group, a carbamoyl group, a thiocarbamoyl group, a nitro group, a nitroso group, a carboxylate group, an acyl group, an acyloxy group, a sulfino group, a sulfonato group, a phosphino group, a phosphinyl group, a phosphonato group, an alkyl ether group, an alkenyl ether group, an alkyl thioether group, an alkenyl thioether group, an aryl ether group, and an aryl thioether group.

In a case where these substituents are monoalkylamino groups, dialkylamino groups, monoarylamino groups, or diarylamino groups, suitable examples of the alkyl group and the aryl group contained in these groups are the same as suitable examples in a case where $R^1$ is an alkyl group or an aryl group.

In a case where these substituents are acyl groups or acyloxy groups, a group which is bonded to a carbonyl group in the acyl groups or the acyloxy groups may be an aliphatic group, an aromatic group, or a group in which an aliphatic group and an aromatic group are combined.

The number of carbon atoms of the acyl group or the acyloxy group is not particularly limited, but is preferably 2 to 15 and more preferably 2 to 10.

Suitable examples of acyl groups as the substituents include an acetyl group, a propanoyl group, a butanoyl group, a benzoyl group, an α-naphthoyl group, and a β-naphthoyl group.

Suitable examples of acyloxy groups as the substituents include an acetyloxy group, a propanoyloxy group, a butanoyloxy group, a benzoyloxy group, an α-naphthoyloxy group, and a β-naphthoyloxy group.

In a case where these substituents are alkyl ether groups, alkenyl ether groups, alkyl thioether groups, alkenyl thioether groups, aryl ether groups, or aryl thioether groups, suitable examples of the alkyl group, the alkenyl group, and the aryl group contained in these groups are the same as suitable examples in a case where $R^1$ is an alkyl group or an alkenyl group.

Suitable examples of the organic group in $R^2$ include an alkyl group, an alkenyl group, a cycloalkyl group, a cycloalkenyl group, an aryl group, an aralkyl group, a monoalkylamino group, a dialkylamino group, a monoarylamino group, a diarylamino group, an acyl group, an acyloxy group, an alkyl ether group, an alkenyl ether group, an alkyl thioether group, an alkenyl thioether group, an aryl ether group, and an aryl thioether group.

In a case where organic groups in $R^2$ are an alkyl group, an alkenyl group, a cycloalkyl group, a cycloalkenyl group, an aryl group, or an aralkyl group, suitable examples of these organic groups are the same as those of $R^1$.

In a case where organic groups in $R^2$ are a monoalkylamino group, a dialkylamino group, a monoarylamino group, a diarylamino group, an acyl group, an acyloxy group, an alkyl ether group, an alkenyl ether group, an alkyl thioether group, an alkenyl thioether group, an aryl ether group, or an aryl thioether group, suitable examples of these organic groups are the same as those of groups described as substituents of an alkyl group, an alkenyl group, a cycloalkyl group, a cycloalkenyl group, and an aralkyl group regarding $R^1$.

In a case where $R^2$ is a hydroxyl group or a mercapto group, a tetrazole compound represented by Formula (B1) may be a tautomer of the following Formula.

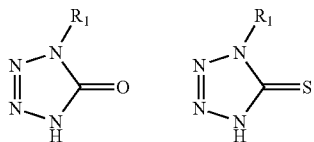

Imidazole compounds represented by the following Formula (B2) are preferable out of imidazole compounds represented by Formula (B1) in that a cleaning liquid particularly excellent in an anticorrosion effect with respect to metals containing cobalt is easily obtained.

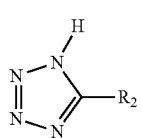

(In Formula (B2), $R^2$ is the same as defined in Formula (B1).)

Suitable specific examples of the tetrazole compound represented by Formula (B1) include following compounds.

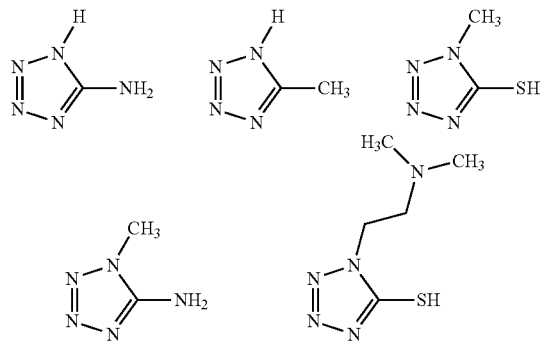

The use amount of cleaning liquid of the above-described tetrazole compound (B) is not particularly limited. The content of tetrazole compound (B) in a cleaning liquid is preferably 0.01 to 10 mass %, more preferably 0.1 to 5 mass %, and particularly preferably 0.2 to 1 mass %.

When the amount of tetrazole compound (B) used is within the range, a cleaning liquid having both an excellent cleaning effect with respect to various residual materials and an excellent anticorrosion effect with respect to metals containing cobalt is easily obtained.

Water (C)

The cleaning liquid according to the present invention essentially contains water (C).

The content of water in the cleaning liquid is preferably 1.0 to 80 mass % and more preferably 15 to 40 mass %.

Basic Compound (D)

The cleaning liquid may contain a basic compound (D) together with the tetrazole compound (B).

The type of basic compound (D) is not particularly limited, and can be appropriately selected from basic compounds which can be used for cleaning residual materials such as photoresist and can be added to a cleaning liquid.

A nitrogen-containing basic compound is preferable as the basic compound (D).

Suitable specific examples of the basic compound (D) include quaternary ammonium hydroxides such as tetramethylammonium hydroxide, tetraethylammonium hydroxide, tetrapropylammonium hydroxide, tetrabutylammonium hydroxide, methyltripropylammonium hydroxide, methyltributylammonium hydroxide, and choline; silazane compounds such as hexamethyldisilazane and hexaethyldisilazane; aminosilane compounds such as trimethylsilyldimethylamine and trimethylsilyldiethylamine; and hydroxylamine compounds such as hydroxylamine and diethylhydroxylamine.

In addition, the following organic amines are also suitable as the basic compounds (D). Specific examples of the organic amines include methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, dimethylaminopropylamine, 2-ethylhexylamine, tetrahydrofurfurylamine, tetramethylethylenediamine, tetraethylethylenediamine, tetrapropylethylenediamine, tetrabutylethylenediamine, methylaminobutylamine, ethylaminobutylamine, propylaminobutylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and hydrazine.

In addition, a compound represented by the following Formula (d-1) is also preferable as the basic compound (D).

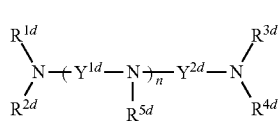

(In Formula (d-1), $R^{1d}$ to $R^{5d}$ each independently represent a hydrogen atom, or an alkyl group having 1 to 6 carbon atoms which may have a hydroxyl group, a carboxyl group, an amino group or a phosphonic acid group, and at least one of $R^{1d}$ to $R^{5d}$ represents a hydrogen atom. One of $R^{1d}$ to $R^{5d}$ may be mutually bonded to $R^{5d}$ to form a ring structure. $Y^{1d}$ and $Y^{2d}$ each independently represent an alkylene group having 1 to 3 carbon atoms, and n represents an integer of 0 to 5. When n is 2 or greater, a plurality of $R^{5d}$s may be each the same or different and a plurality of $Y^{1d}$s may be each the same or different, $R^{5d}$s may be bonded to each other to form a ring structure.)

The alkyl group having 1 to 6 carbon atoms which may be represented by $R^{1d}$ to $R^{5d}$ may be either linear or branched, and is preferably linear. Specific examples of the alkyl group include a methyl group, an ethyl group, an n-propyl group, an n-butyl group, an n-pentyl group, and an n-hexyl group. Of these, an ethyl group is most preferable.

This alkyl group may have a hydroxyl group, a carboxyl group, an amino group, or a phosphonic acid group. Specific examples thereof include a 2-hydroxyethyl group, a 2-carboxyethyl group, a 2-aminoethyl group, and a 2-phosphonic ethyl group.

Examples of the ring structure which may be formed by bonding one of $R^{1d}$ to $R^{4d}$ to $R^{5d}$, or the ring structure which may be formed by bonding $R^{5d}$s to each other include a piperazine ring.

The alkylene group having 1 to 3 carbon atoms which may be represented by $Y^{1d}$ and $Y^{2d}$ may be either linear or branched, and is preferably linear. Specific examples of the alkylene group include a methylene group, an ethylene group, and a propylene group. Of these, an ethylene group is most preferable.

"n" represents an integer of 0 to 5, and is more preferably an integer of 0 to 2.

Specific examples of the basic compound represented by the above-described Formula (d-1) include ethylenediamine, N-(2-aminoethyl)-1,2-ethanediamine (=diethylenetriamine), N,N'-bis(2-aminoethyl)-1,2-ethanediamine (=triethylenetetramine), tris(2-aminoethyl)amine, N,N'-bis(2-aminoethyl)piperazine, N-[(2-aminoethyl)-2-aminoethyl]piperazine, N-(2-aminoethyl)-N'-{2-[(2-aminoethyl)amino]ethyl}-1,2-ethanediamine (=tetraethylenepentamine), 4-(2-aminoethyl)-N-(2-aminoethyl)-N'-{2-[(2-aminoethyl)amino]ethyl}-1,2-ethanediamine, 1-(2-aminoethyl)-4-{[(2-aminoethyl)amino]ethyl}piperazine, 1-{2-[[2-[(2-aminoethyl)amino]ethyl]amino]ethyl}piperazine, 1-piperazineethaneamine, and 2-[(2-aminoethyl)amino]ethanol.

Among the basic compounds represented by the above-described Formula (d-1), basic compounds represented by the following Formula (d-2) are preferable.

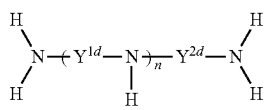

(d-2)

(In Formula (d-2), $Y^{1d}$, $Y^{2d}$, and n are the same as defined in Formula (d-1).)

Specific examples of the basic compound represented by Formula (d-2) include ethylenediamine, N-(2-aminoethyl)-1,2-ethanediamine (=diethylenetriamine), N,N'-bis(2-aminoethyl)-1,2-ethanediamine (=triethylenetetramine), tetraethylenepentamine, pentaethylene hexamine, dimethylenetriamine, and trimethylenetetramine.

Of these, N-(2-aminoethyl)-1,2-ethanediamine (=diethylenetriamine) and N,N'-bis(2-aminoethyl)-1,2-ethanediamine (=triethylenetetramine) are particularly preferable in that a cleaning liquid having particularly high anticorrosion properties with respect to metals is easily obtained.

The above-described basic compounds (D) may be used alone or in combination of two or more thereof.

The content of the basic compound (D) can be appropriately adjusted in accordance with the content of hydrofluoric acid, and is preferably 0.01 to 2.00 mass % and more preferably 0.01 to 1.24 mass % in the cleaning liquid. Cleaning and removing properties of various residual materials tend to be more effectively balanced with anticorrosion properties with respect to metals containing cobalt.

The pH of the cleaning liquid in a state where the basic compound (D) is added or not added thereto is preferably 4 to 9 from the viewpoint of an anticorrosion effect with respect to cobalt.

The pH of the cleaning liquid is a value measured at 25° C. Water-Soluble Organic Solvent (E)

The cleaning liquid may contain a water-soluble organic solvent (E).

Examples of the water-soluble organic solvent (E) include: sulfoxides such as dimethylsulfoxide; sulfones such as dimethylsulfone, diethylsulfone, bis(2-hydroxyethyl)sulfone, and tetramethylenesulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; lactones such as γ-butyrolactone and δ-valerolactone; and polyhydric alcohols and derivatives thereof such as ethylene glycol, propylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, and diethylene glycol monobutyl ether.

In addition, N,N-dialkyl fatty acid amide represented by the following Formula (e-1) is also preferable as the water-soluble organic solvent (E). In a case where the cleaning liquid contains N,N-dialkyl fatty acid amide represented by Formula (e-1), a cleaning liquid of which the etching rate hardly changes even due to continuous use is easily obtained.

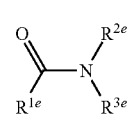

(e-1)

(In Formula (e-1), $R^{1e}$ represents an isopropyl group or a 1-hydroxy-1-methyl ethyl group, and $R^{2e}$ and $R^{3e}$ each independently represent an alkyl group having 1 to 4 carbon atoms.)

$R^{2e}$ and $R^{3e}$ in Formula (e-1) each independently represent an alkyl group having 1 to 4 carbon atoms. The alkyl group may be linear or branched. Specific examples of the alkyl group having 1 to 4 carbon atoms include a methyl group, an ethyl group, an n-propyl group, an isopropyl group, an n-butyl group, a sec-butyl group, an isobutyl group, and tert-butyl group. Among these alkyl groups, a methyl group and an ethyl group are preferable.

Specific examples of N,N-dialkyl fatty acid amide represented by Formula (e-1) include N,N-dimethylisobutylamide, N-ethyl, N-methylisobutylamide, N,N-diethylisobutylamide, 2-hydroxy-N,N,2-trimethylpropaneamide, N-ethyl-2-hydroxy-N,2-dimethylpropaneamide, and N,N-diethyl-2-hydroxy-2-methylpropaneamide. Of these, N,N-dimethylisobutylamide, N-ethyl, N-methylisobutylamide, 2-hydroxy-N,N,2-trimethylpropaneamide, and N-ethyl-2-hydroxy-N,N,2-dimethylpropaneamide are preferable. Particularly, N,N-dimethylisobutylamide, and 2-hydroxy-N,N,2-trimethylpropaneamide are more preferable.

The cleaning liquid may contains a combination of two or more types of N,N-dialkyl fatty acid amides as the water-soluble organic solvent (E).

Furthermore, 3-alkoxy-3-methyl-1-butanol represented by the following Formula (e-2) is also preferable as the water-soluble organic solvent (E). 3-alkoxy-3-methyl-1-butanol is particularly excellent in performance of removing residues.

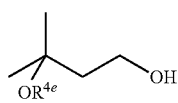

(e-2)

(In Formula, $R^{4e}$ represents an alkyl group having 1 to 5 carbon atoms.)

Examples of the alkyl group having 1 to 5 carbon atoms represented by $R^{4e}$ in Formula (e-2) include a methyl group, an ethyl group, an n-propyl group, an isopropyl group, an n-butyl group, an isobutyl group, a t-butyl group, and n-pentyl group. Among these, an alkyl group having 1 to 3 carbon atoms is preferable, a methyl group or an ethyl group is more preferable, and a methyl group is still more preferable from the viewpoint of solvency.

3-methoxy-3-methyl-1-butanol (MMB) is particularly preferable as 3-alkoxy-3-methyl-1-butanol represented by the Formula (e-2).

The content of the water-soluble organic solvent (E) in the cleaning liquid is preferably 1.0 to 90 mass %, more preferably 10 to 80 mass %, and particularly preferably 20 to 50 mass %.

Other Components

The cleaning liquid may further contain an anticorrosion agent together with the tetrazole compound (B).

This anticorrosion agent is not particularly limited, and a conventionally well-known anticorrosion agent can be used, which is preferably a benzotriazole compound or a mercapto group-containing compound.

Examples of the benzotriazole compound include compounds represented by the following Formula (f-1).

(f-1)

In the above-described Formula (f-1), $R^{1f}$ and $R^{2f}$ each independently represent a hydrogen atom, a hydrocarbon group having 1 to 10 carbon atoms which may have a substituent, a carboxyl group, an amino group, a hydroxyl group, a cyano group, a formyl group, a sulfonylalkyl group, or a sulfo group, and Q represents a hydrogen atom, a hydroxyl group, a hydrocarbon group having 1 to 14 carbon atoms which may have a substituent (where the hydrocarbon group may be interrupted by an amide bond or an ester bond), or a group represented by the following Formula (f-2).

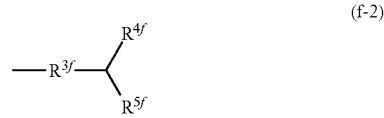

(f-2)

In the above-described Formula (f-2), $R^{3f}$ represents an alkylene group having 1 to 6 carbon atoms, and $R^{4f}$ and $R^{5f}$ each independently represent a hydrogen atom, a hydroxyl group, or a hydroxyalkyl group or an alkoxyalkyl group having 1 to 6 carbon atoms.

In each of the definitions of $R^{1f}$, $R^{2f}$, and Q in the above-described Formula (f-1), the hydrocarbon group may be either an aromatic hydrocarbon group or an aliphatic hydrocarbon group, may include an unsaturated bond, and may be a linear, branched, or cyclic hydrocarbon group. Examples of the aromatic hydrocarbon group include a phenyl group, and a p-tolyl group. Examples of the linear aliphatic hydrocarbon group include a methyl group, an n-propyl group, and a vinyl group. Examples of the branched aliphatic hydrocarbon group include an isobutyl group and a tert-butyl group. Examples of the cyclic aliphatic hydrocarbon group include a cyclopentyl group and a cyclohexyl group. Examples of the hydrocarbon group having a substituent include a hydroxyalkyl group and an alkoxyalkyl group.

In addition, Q in the above-described Formula (f-1) is preferably a group represented by the above-described Formula (f-2). In particular, of the groups represented by the above-described Formula (f-2), it is preferable to select a group in which $R^{4f}$ and $R^{5f}$ are each independently a hydroxyalkyl group or an alkoxyalkyl group having 1 to 6 carbon atoms.

Furthermore, it is preferable to select Q such that the compound represented by the above-described Formula (f-1) exhibits water-soluble properties. Specifically, a hydrogen atom, an alkyl group having 1 to 3 carbon atoms (that is, a methyl group, an ethyl group, a propyl group, or an isopropyl group), a hydroxyalkyl group having 1 to 3 carbon atoms, a hydroxyl group, and the like are preferable.

Specific examples of the benzotriazole compound include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, and 1-(2,3-dihydroxypropyl)benzotriazole; and 2,2'-{[(4-methyl-1H-benzotriazole-1-yl)methyl]imino}bisethanol, 2,2'-{[(5-methyl-1H-benzotriazole-1-yl)methyl]imino}bisethanol, 2,2'-{[(4-methyl-1H-benzotriazole-1-yl)methyl]imino}bisethane, 2,2'-{[(4-methyl-1H-benzotriazole-1-yl)methyl]imino}bispropane, and the like that are commercially available from BASF as "IRGAMET" series.

Among these, 1-(2,3-dihydroxypropyl)-benzotriazole, 2,2'-{[(4-methyl-1H-benzotriazole-1-yl)methyl]imino}bisethanol, 2,2'-{[(5-methyl-1H-benzotriazole-1-yl)methyl]imino}bisethanol, and the like are preferable.

These benzotriazole compounds may be used alone, or in combination of two or more thereof.

The above-described mercapto group-containing compound is preferably a compound containing a hydroxyl group and/or a carboxyl group on at least one of the α-position and the β-position of a carbon atom that is bonded to the mercapto group. Specific examples of such compounds include 1-thioglycerol, 3-(2-aminophenylthio)-

2-hydroxypropylmercaptan, 3-(2-hydroxyethylthio)-2-hydroxypropylmercaptan, 2-mercaptopropionic acid, and 3-mercaptopropionic acid. Of these, it is particularly preferable to use 1-thioglycerol.

These mercapto group-containing compounds may be used alone, or in combination of two or more thereof.

In a case where the anticorrosion agent is contained, the content in the cleaning liquid is preferably 0.1 to 10 mass % and more preferably 0.5 to 5 mass %.

In addition, the cleaning liquid according to the present invention may further contain a surfactant.

The surfactant is not particularly limited, and it is possible to use a conventionally well-known surfactant which is preferably an acetylene alcohol based surfactant.

In a case where the surfactant is contained, the content in the cleaning liquid is preferably 0.01 to 5 mass % and more preferably 0.05 to 2 mass %.

Due to essentially containing the above-described components (A) to (C), the cleaning liquid can have suitably clean residual materials of a photoresist pattern or etching residual materials and is excellent in anticorrosion properties with respect to metals containing cobalt.

For this reason, the above-described cleaning liquid is suitably used for cleaning a substrate in a case where at least a part of the surface of the substrate is formed of metals containing cobalt.

Particularly, the above-described cleaning liquid is suitably used as a cleaning liquid used when forming a fine metal wiring pattern using metals containing cobalt.

The cleaning method is not particularly limited, and examples thereof include an immersion method and a spray method. The treatment can be carried out by either a batch-wise processing or a single wafer processing. The time period for the cleaning and removing is not particularly limited, and is typically about 10 to 30 minutes in a batch-wise processing and about 0.5 to 3 minutes in a single wafer processing. The cleaning liquid according to the present invention is preferably used for a single wafer processing. The temperature of the cleaning liquid is not particularly limited, and is typically about 25 to 70° C.

After the cleaning using the cleaning liquid, a rinse treatment with pure water, a lower alcohol or the like, and a dry treatment may be also carried out.

EXAMPLES

Hereinafter, the present invention will be described in more detail while showing Examples of the present invention, but the present invention is not limited to the following Examples.

Examples 1 to 5 and Comparative Examples 1 to 8

Preparation of Cleaning Liquid

A cleaning liquid of each Example was prepared after uniformly mixing 0.1 mass % of hydrofluoric acid, 0.5 mass % of each type of tetrazole compound described in Table 1, 30 mass % of 3-methoxy-3-methyl-1-butanol as a water-soluble organic solvent, tetrahydrofurfurylamine in the amount described in Table 1 as a basic compound, and the remainder of water with each other.

A cleaning liquid of Comparative Example 1 was prepared similarly to those of Examples except that no tetrazole compound was used.

In addition, cleaning liquids of Comparative Examples 2 to 8 were prepared similarly to those of Examples except that 0.5 mass % of each type of heterocyclic compound described in Table 1 instead of 0.5 mass % of the tetrazole compound.

pH values of the cleaning liquids of Examples and Comparative Examples which had been measured at 25° C. were denoted in Table 1.

In Examples, the following B1 to B5 were used as the tetrazole compound (B).

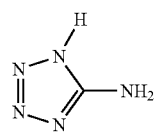
B1

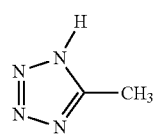
B2

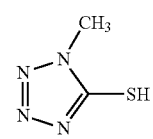
B3

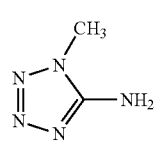
B4

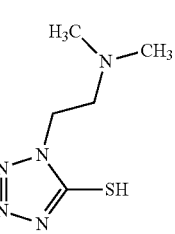
B5

In Comparative Example, the following B6 to B12 were used as the heterocyclic compound instead of the tetrazole compound (B).

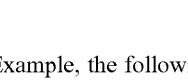
B6

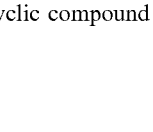
B7

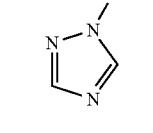
B8

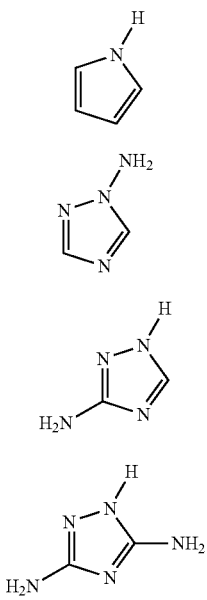

Cobalt Corrosion Resistance Evaluation

A substrate including a cobalt layer with a thickness of 100 nm was used as an outermost layer for evaluation of anticorrosion properties. The cobalt layer was formed on a titanium layer with a thickness of 20 nm.

The substrate was immersed in the cleaning liquids of Examples and Comparative Examples for 15 minutes at 50° C. After the immersion, the surface of the substrate was rinsed with water, and then, the substrate was dried through blowing nitrogen.

A sheet resistance value of the cobalt layer of the substrate after the drying was measured through a four-probe method and the film thickness (A) of the cobalt layer after the immersion was measured.

The etching rate of the cobalt layer was obtained from the change in the film thickness of the cobalt layer before and after the immersion.

Measurement results of the etching rate (Å/min.) are shown in Table 1.

In Comparative Examples 4 and 5, stripping away of the cobalt layer caused, and therefore, it was impossible to obtain the etching rate.

Substrate Surface Condition

The presence or absence of white blur or the presence or absence of stripping away of the cobalt layer regarding the cobalt layer after the immersion in the cleaning liquid in the cobalt corrosion resistance evaluation was visually observed to evaluate the condition of the surface of the substrate.

The observation results are denoted in Table 1.

TABLE 1

|  | Tetrazole compound or heterocyclic compound | Basic compound (mass %) | pH | Etching rate (Å/min.) | Substrate surface condition |
|---|---|---|---|---|---|
| Example 1 | B1 | 0.2 | 5.24 | 0.02 | No change |
| Example 2 | B2 | 0.3 | 5.19 | 0.22 | No change |
| Example 3 | B3 | 0.6 | 5.27 | 4.14 | No change |
| Example 4 | B4 | 0.16 | 5.50 | 3.51 | No change |
| Example 5 | B5 | 0.17 | 4.77 | 7.31 | No change |

TABLE 1-continued

|  | Tetrazole compound or heterocyclic compound | Basic compound (mass %) | pH | Etching rate (Å/min.) | Substrate surface condition |
|---|---|---|---|---|---|
| Comparative Example 1 | None |  | 0.3 | 6.70 | 16.37 | Blur |
| Comparative Example 2 | B6 | 0.3 | 4.76 | 12.30 | Partially stripped away |
| Comparative Example 3 | B7 | 0.3 | 7.28 | 17.24 | No change |
| Comparative Example 4 | B8 | 0.3 | 4.78 | — | Stripped away |
| Comparative Example 5 | B9 | 0.3 | 3.96 | — | Stripped away |
| Comparative Example 6 | B10 | 0.3 | 4.66 | 17.94 | Blur |
| Comparative Example 7 | B11 | 0.3 | 5.12 | 16.09 | Blur |
| Comparative Example 8 | B12 | 0.3 | 5.26 | 17.01 | No change |

It can be seen from Examples and Comparative Examples that either cobalt is remarkably etched or a harmful effect such as stripping away of a cobalt layer state is caused in a case of using cleaning liquids of Comparative Examples which contain a heterocyclic compound other than a tetrazole compound or contain neither a tetrazole compound nor other heterocyclic compounds, whereas the etching of cobalt is remarkably suppressed in a case of using cleaning liquids of Examples which contain a tetrazole compound.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A cleaning liquid comprising:
hydrofluoric acid;
a tetrazole compound; and
water,
wherein the pH of the cleaning liquid is between 4.77 and 5.27.

2. The cleaning liquid according to claim 1, wherein the tetrazole compound is represented by the following Formula (B1):

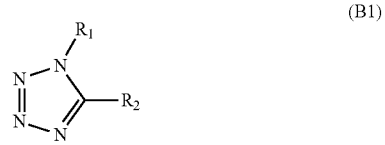

wherein $R^1$ is a hydrogen atom or an organic group and $R^2$ is a hydrogen atom, a hydroxyl group, a mercapto group, an amino group, or an organic group.

3. The cleaning liquid according to claim 2, wherein $R^1$ is a hydrogen atom.

4. The cleaning liquid according to claim 1, further comprising a basic compound.

5. The cleaning liquid according to claim 1, further comprising a water-soluble organic solvent.

6. A method for cleaning a substrate, comprising contacting the substrate with the cleaning liquid according to claim 1.

7. The method according to claim 6, wherein at least a part of the surface of the substrate is formed of metals containing cobalt.

8. The cleaning liquid according to claim 2, wherein $R^1$ is an alkyl group optionally substituted with a dialkylamino group.

9. The cleaning liquid according to claim 8, wherein the tetrazole compound comprises at least a compound represented by any one of the following formulas B3 to B5:

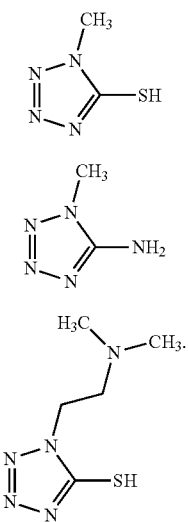

10. The cleaning liquid according to claim 4, wherein the basic compound comprises tetrahydrofurfurylamine.

11. The cleaning liquid according to claim 1, consisting essentially of:
hydrofluoric acid;
the tetrazole compound;
water;
a basic compound; and
a water-soluble organic solvent.

12. A cleaning liquid comprising:
hydrofluoric acid;
a tetrazole compound; and
water,
wherein the tetrazole compound is represented by the following Formula (B1):

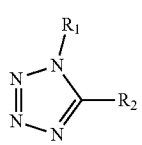

wherein $R^1$ is an alkyl group optionally substituted with a dialkylamino group, and $R^2$ is a hydrogen atom, a hydroxyl group, a mercapto group, an amino group or an organic group.

13. The cleaning liquid according to claim 12, wherein the tetrazole compound comprises at least a compound represented by any one of the following formulas B3 to B5:

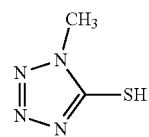

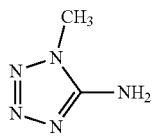

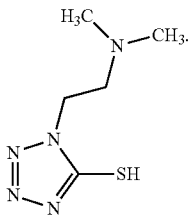

14. The cleaning liquid according to claim 12, further comprising a basic compound, wherein the basic compound comprises tetrahydrofurfurylamine.

15. A cleaning liquid consisting essentially of:
hydrofluoric acid;
a tetrazole compound;
water;
a basic compound; and
a water-soluble organic solvent.

16. The cleaning liquid according to claim 15, wherein the tetrazole compound is represented by the following Formula (B1):

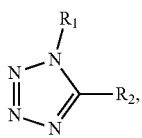

wherein $R^1$ is a hydrogen atom or an organic group and $R^2$ is a hydrogen atom, a hydroxyl group, a mercapto group, an amino group or an organic group.

17. The cleaning liquid according to claim 16, wherein the $R^1$ is an alkyl group optionally substituted with a dialkylamino group.

18. The cleaning liquid according to claim 17, wherein the tetrazole compound comprises at least a compound represented by any one of the following formulas B3 to B5:

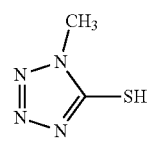

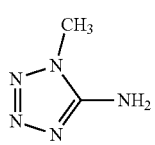

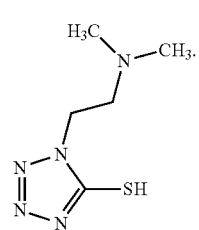 B5
19. The cleaning liquid according to claim 15, wherein the basic compound comprises tetrahydrofurfurylamine.
* * * * *